United States Patent [19]
Bianca et al.

[11] Patent Number: 5,775,945
[45] Date of Patent: *Jul. 7, 1998

[54] SPLICING OF DISCRETE COMPONENTS OR ASSEMBLIES RELATED APPLICATIONS

[75] Inventors: Giuseppe Bianca, Temecula; Robert M. Bogursky, Encintas, both of Calif.

[73] Assignee: Autosplice Systems Inc., San Diego, Calif.

[*] Notice: The term of this patent shall not extend beyond the expiration date of Pat. No. 5,616,053.

[21] Appl. No.: 764,385

[22] Filed: Dec. 13, 1996

Related U.S. Application Data

[63] Continuation-in-part of Ser. No. 498,536, Jul. 5, 1995, Pat. No. 5,616,053, and Ser. No. 761,899, Dec. 9, 1996.

[51] Int. Cl.⁶ .................................................. H01R 13/40
[52] U.S. Cl. ..................................... 439/590; 439/937
[58] Field of Search ........................... 439/78, 590, 885, 439/894, 937; 29/883, 884, 842

[56] References Cited

U.S. PATENT DOCUMENTS

| 2,396,725 | 3/1946 | Thomas, Jr. | 173/324 |
| 3,471,900 | 10/1969 | Burns | 18/36 |
| 4,230,387 | 10/1980 | Zahn . | |
| 4,391,482 | 7/1983 | Czeschka . | |
| 4,404,744 | 9/1983 | Stenz et al. | 29/883 |
| 4,617,733 | 10/1986 | Olson | 29/874 |
| 4,655,517 | 4/1987 | Bryce . | |
| 4,686,766 | 8/1987 | Dubbs et al. | 29/883 |
| 4,832,622 | 5/1989 | Zahn | 439/590 |
| 4,961,895 | 10/1990 | Klein | 264/40.6 |
| 5,112,255 | 5/1992 | Daley, Jr. | 439/885 |

*Primary Examiner*—Khiem Nguyen

[57] ABSTRACT

A continuous electrical connector or component part of plastic or metal manufactured by injection molding of axial discrete segments. A novel in-line chaining structure is provided for interlocking adjacent discrete segments. The interlocking structure comprises complementary reduced-size fitted end units pinned together by a matching component, or a multi-component splicing device which engages one or more holes in adjacent segment units. The resultant strip can be wound up on a reel.

24 Claims, 2 Drawing Sheets

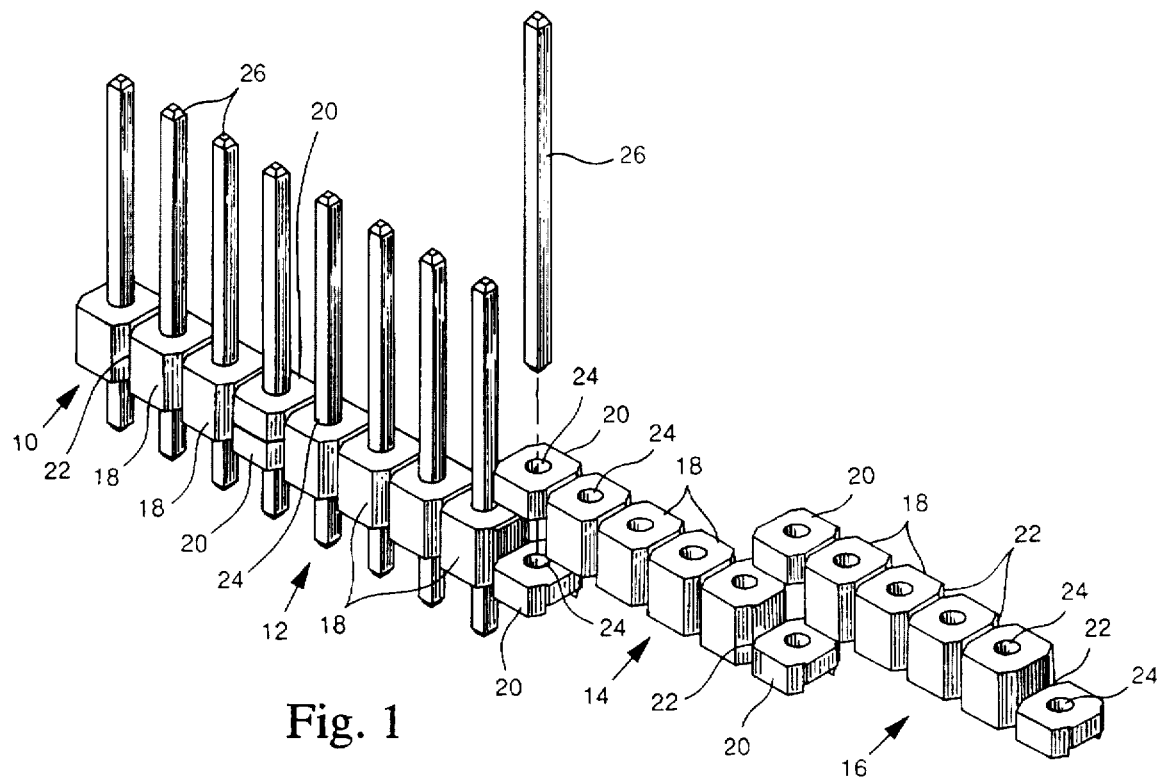
Fig. 1
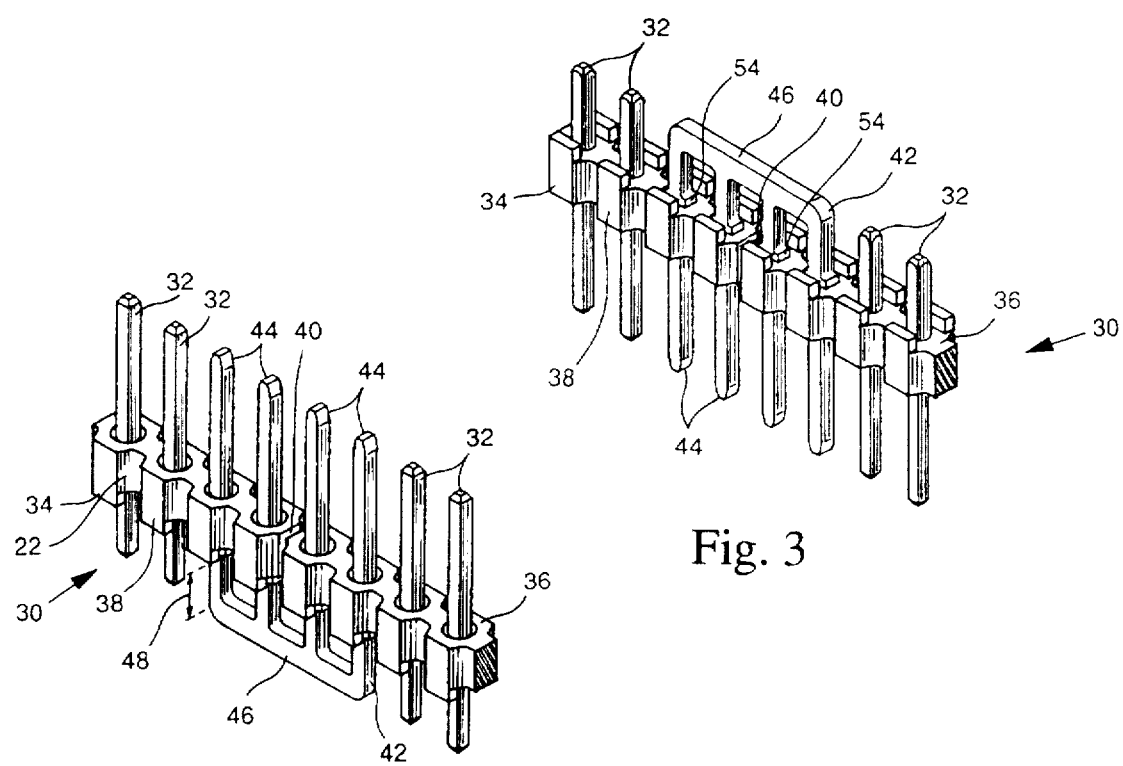
Fig. 2
Fig. 3

SPLICING OF DISCRETE COMPONENTS OR ASSEMBLIES RELATED APPLICATIONS

RELATED APPLICATIONS

This application is a continuation-in-part of a first commonly-assigned, patent application Ser. No. 08/498,536, filed Jul. 5, 1995, now U.S. Pat. No. 5,717, 053.

This application is a continuation-in-part of a second commonly-assigned, copending patent application, Ser. No. 08/761,899, filed Dec. 9, 1996, entitled "Continuous Molded Plastic Components Or Assemblies".

This invention relates to the manufacture of continuous molded components or assemblies and to the resultant strip of components or assemblies.

BACKGROUND OF THE INVENTION

Electrical connectors comprising an insulating body having electrical contacts carried thereby are well known in the art. In the so-called male pin connectors or header, the insulating body carries pin-like contacts which extend above and below the insulating body to facilitate electrical connection from one element, such as a printed circuit board (PCB), to another element, which may, for example, comprise a so-called female connector. As is well known, a female connector comprises an insulating body which carries an electrical contact which is generally capable of receiving at one end thereof a male pin, and at the other end thereof an electrical conductor which may be another male pin, a single electrical conductor, or a single strand of a multiconductor flat ribbon cable. Typically, the aforedescribed male connector and female connector are utilized in a tandem or coupled fashion to provide electrical connection from one element such as the printed circuit paths on a PCB to individual conductors or the multiple conductors of a multiconductor ribbon cable.

The aforedescribed male and female type connectors are generally manufactured with a predetermined number of contacts. For example, a typical male connector of the type described above might comprise a length of insulating material having two, ten, twenty, thirty, or any number of pins carried thereby. Similarly, a female connector may comprise a body of insulating material having individual cavities disposed therein, each cavity of which carries an electrical contact. Like the male connectors, the female connectors are commonly manufactured with two, ten, twenty, thirty, etc., contacts.

There are drawbacks associated with the manufacture and use of both male and female connectors of the type described above. The end user may use several connectors, each having a different number of electrical contacts or "positions". He must therefore purchase and inventory many different connector sizes, i.e., he must maintain a supply of 8-position, 12-position, 20-position connectors, etc.

A continuous connector strip for solving this problem was disclosed in U.S. Pat. No. 4,230,387. U.S. Pat. No. 4,832, 622 (the '622 patent), whose contents are herein incorporated by reference, describes a better solution to the problem involving continuous extrusion or semi-continuous injection molding of a strip of integrally linked segments of plastic material into which contact pins may be inserted and from which individual connectors having the desired number of contacts may be severed. The referenced copending applications show other possible solutions to the problem by providing each segment with a trailing projecting portion, substantially in-line with the strip, with undercuts or recessed regions behind the projecting portion. The projecting portion of each previously-molded segment is reinserted in the mold and the leading portion of the next segment molded over and around the projecting portion to provide a strong interlocking structure substantially in-line with the connector strip. In a preferred embodiment, the projecting portion has a hole for receiving an electrical or mechanical part, and the overmolded part also has a hole, with both holes aligned to receive the electrical or mechanical part. In this way, despite the fact that the resultant interlocking structure is in-line in the strip, a position for an electrical or mechanical part is not lost, so that for an application where, say, electrical pins are provided in evenly-spaced holes in the strip, a pin can also be placed in the aligned holes of the interlocking structure to maintain the pitch and symmetry.

The second referenced copending application also shows providing the electrical or mechanical parts to be added to the molded strip in the mold when the electrically-insulating parts are molded, with the result that the previously-molded segment including the projecting portion already incorporates the electrical or mechanical parts and thus in the next cycle the projecting portion need only be overmolded with electrically-insulating material to form a solid interlocking structure. Thus, it is not necessary as a separate step to insert the electrical or mechanical parts in the holes in the completed strip following the molding step.

However, certain situations may arise where a user is confronted with segments that have separated from the continous strip, with the result that automatic insertion or placement machines which often operate with a reel of the strips as the supply source cannot be used if only discrete segments are available. Moreover, there may arise situations where the supplier provides only separately molded discrete segments yet the user desires a continuous strip for assembly purposes by automatic machines.

SUMMARY OF THE INVENTION

An object of the invention is an improved process for forming a continuous strip of components starting from discrete segments of material with or without components.

A further object of the invention is an improved process for forming a continuous strip from discrete segments of electrically-insulating material with holes for receiving electrical or mechanical parts.

Another object of the invention is a continuous strip of parts or components of injection molded insulating material which can be used for any purpose.

In accordance with one aspect of the present invention, a continuous strip of parts or components can be formed by chaining together discrete segments to form a continuous strip. In a preferred embodiment, the discrete segments are a plurality of in-line plastic insulators to form a continuous electrical pin header.

Preferably, the chaining is carried out with a splicing device that has a structure generally corresponding to the structure that exists or will be formed in the final product and that engages holes in adjacent ends of the discrete segments. In a preferred embodiment, the adjacent ends have complementary reduced-size portions that when fitted together form one whole unit of a segment and are linked together by the splicing device.

In accordance with another aspect of the invention, a chaining mechanism can be used which does not require complementary ends of adjacent segments. In this case, the chaining mechanism makes use of a splicing device comprising plural interlinked components engaging holes in adjacent ends of the discrete segments.

3

Preferably, the segments are provided with severance means, such as notches or score marks, for severing from the strip a discrete length of the material containing one or more components for any of many uses, such as, for example, pin or terminal headers.

The discrete segments in the final strip product are interconnected by a strong interlocking structure that allows the strip to be reeled up for use on a conventional insertion or placement machine.

The invention is applicable not only to injection-molded insulating plastic materials, but also to other similarly formable materials and processes. Typical insulating plastics such as ABS, PPA, polyesters, and polycarbonates can be used to make insulating parts, as well as silicone rubber materials. In adition, the parts can be made electrically-conductive by using electrically conductive plastics or by compounding insulating material with stainless steel fibers, carbon fibers or carbon powder. The formable material can also include fibers for reinforcement, such as glass fibers. In addition, the invention is also applicable to the molding of metals, typically low-melting-point metals such as zinc. The process of injection molding of zinc is called die casting, but the process is very similar to the injection molding of plastics in that the zinc is melted and as a fluid is injected under pressure into a die or mold using runners to direct the molten metal into a cavity or cavities, and cores if desired may also be introduced to make more complex shapes. For further information, reference is made to "Product Design For Die Casting", published in 1996 by the Diecasting Development Council, 4th Ed., Ch. 4, Pgs. 97–102, whose contents are herein incorporated by reference. Thus, the terms "molded", "injection-molded", "moldable", or "molding" as used herein should be understood in the broadest sense to include not only injection molding of plastics or other formable materials but also die casting of metals and similar processes.

These and other objects and attainments together with a fuller understanding of the invention will become apparent and appreciated by referring to the following descriptions and claims taken in conjunction with the accompanying drawings which illustrate by way of example and not limitation preferred embodiments of the invention and wherein like reference numerals denote like or corresponding parts.

SUMMARY OF THE DRAWINGS

In the drawings:

FIG. 1 is a perspective view illustrating schematically the pinning together of discrete segments to form a continuous strip in accordance with one preferred form of the invention;

FIG. 2 is a partial perspective view of two chained segments to form a continuous connector strip in accordance with another preferred form of the invention;

FIGS. 3 and 4 are, respectively, a perspective view from the bottom and a partial side view of the FIG. 2 embodiment;

DETAILED DESCRIPTION OF PREFERRED EMBODIMENTS

Figure 4:
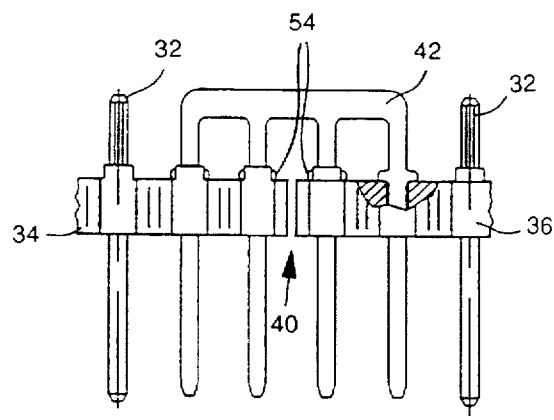

The '622 patent illustrates various pin header configurations available from a continuous strip of insulating material with holes filled with contact elements. The continuous strip can be fabricated by extrusion or by a semi-continuous injection molding process. The present invention is directed to the situation where a continuous strip of moldable material is unavailable, for example in a situation wherein only discretely-molded segments of the strip for one or more reasons are available. One such situation could arise where the user desires to purchase a plurality of off-the-shelf discrete segments containing many pin positions, but desires to use commercially-available automatic insertion or placement equipment to minimize assembly costs. However, many of the more popular forms of such equipment use reel sources of an extended continuous length of the strips. The present invention provides an inexpensive way of interconnecting discrete segments of arbitrary length into a continuous strip which can be reeled up on a conventional reel for supplying material to an automatic insertion or placement machine.

FIG. 1 illustrates schematically the pinning together of discrete segments to form a continuous strip. The discrete segments are designated 10, 12, 14, and 16. Each segment comprises a strip of full-size or normal header units 18 with at least one reduced size unit 20 at one or both ends of each segment. Each full-size unit 18 comprises a body of electrically-insulating material, for example of plastic, integrally connected to its neighboring units by a reduced cross-section member 22 formed, for example, by notching, and containing a hole 24 for receiving a press-fitted electrically-conductive pin 26, typically of a copper alloy, and representing a pin position of the segment. While only a small number of pin positions per segment is shown, each of the segments can have any arbitrary number of pin positions. The reduced size units 20 each also have a hole 24 and are also integrally connected to their normal sized neighbor. In this preferred embodiment, the height of the reduced-size units 20 are approximately one-half that of the normal-sized units 18, so two overlapped half units, as shown at the fourth unit from the left in FIG. 1, form one whole unit, but this is not essential to the invention, and they can be given any height that will provide a reasonable degree of strength for their coupling to their neighbors. As schematically illustrated in FIG. 1, the segments can be pinned together by overlapping one half-sized lower unit 20 with an adjacent half-sized upper unit 20 and then inserting or press-fitting a pin 26 through the overlying aligned holes 24. In FIG. 1, segments 10, 12 are shown pinned together at the left, the center shows segments 12 and 14 in the process of being pinned together, and at the right is shown segments 14 and 16 waiting to be pinned. The pinning can be achieved manually or by an insertion machine. The insertion of the pin 26 in a hole 24 is a press-fit operation as described in the referenced applications, and structure can be added if desired to the pin to increase the pull-out force. As will be noted, no pin positions are lost in the process, and the pin pitch is maintained. The resultant strip of pin headers can be reeled up for distribution or future assembly. Preferably, the pinning is carried out with a pinning member, in this case, the pin 26, that has a structure generally corresponding to the structure that exists (the other pins) or will be formed in the ultimate product, and thus a method of producing continuous plastic components or assemblies for automation processes results that is an improvement over the current state of the art which uses parts packaged in an embossed carrier tape ("Tape and Reel" per EIA-STD-481), package trays, tubes, or other multiple feed devices, which can require a secondary packaging operation. The resultant strip can be of any length (number of cavities, single or dual row), size, shape, or configuration.

In the previous preferred embodiment, a chaining mechanism for discrete segments is achieved by providing on each molded segment a leading and trailing end which consists of a single position of either the top half or bottom half of the insulator around a hole, and a pin which is part of the final assembly is then inserted through the top half of the first insulator and the bottom half of another insulator to form interlock sections of a continuous chain of pins and insulators that are completely secure, and will not separate from the individual component.

In a second preferred embodiment, a chaining mechanism can be used which does not require that the holes in the leading and trailing ends of the insulators be one-half of the material thickness. In this case, the preferred chaining mechanism is a multiple splicing pin, i.e., a pin which is linked at the base to permanently attach, preferably, four pins together, though as few as two can be used, on a specific pitch equal to the pitch of the insulators so that when inserted into two discretely molded insulator segments which are placed end-to-end the two segments are spliced together and a continuous finished strip is created. By "pitch of the insulators" is meant the center-to-center spacing of the pin holes. The multiple splicing pin is preferred in this embodiment because the arrangement of the pins in the splicing device is similar to that of the other pins in the product. That is to say, the immediate area of the splice above or below the insulator is similar to the assembled pins. This not only simplifies reeling up of the product as the drive mechanism which can use the pins to push on will not detect the splice, but also promotes inspection of the final product, which inspection often involves detecting product uniformity deviations. The preferred splicing device embodiment possesses the same general characteristics (e.g., pin height) as the rest of the product and thus would pass such an inspection. However, a detection device can still be arranged to detect the presence of the splice by, for example, looking for the linking part at the base.

On the other hand, it may be desirable to enhance detection in automatic equipment of where the splicing device or devices are located in a continuous strip, in which case the splicing device would deliberately be given characteristics or a configuration that differs from that of the other components, so it can readily be detected. Such differing characteristics or configuration can, for example, be different pin heights or widths, or a different pitch than that of the components.

Figure 5:
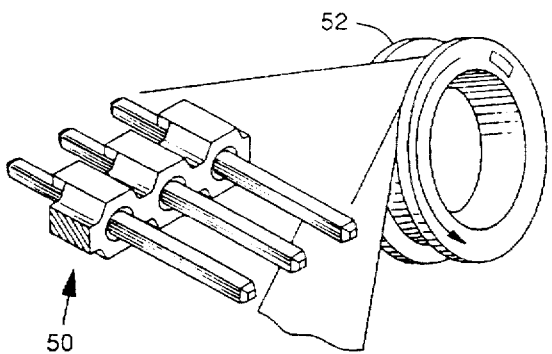
FIG. 5 illustrates how the user would receive or use a reeled continuous strip made in accordance with the invention.

FIGS. 2–4 illustrate one form of the second embodiment producing a pin header 30 containing a single row of pins 32. Again, for the sake of brevity, only a limited number of pin positions are shown. This aspect of the invention is useful for forming long continuous strips of discrete segments 34, 36 comprising full-size leading and trailing header units 38, and is also useful where initially a long continuous strip existed but was deliberately or accidentally broken at reduced thickness body sections, as shown for example at 40, and the user desires to reform a continuous strip. In FIGS. 2–4, the break or separation between adjacent discrete segments 34, 36 is shown at 40. The splicing pin is designated 42 and comprises in this embodiment four pins 44 joined at one end by a base portion 46. The pins 44 are spaced apart in their longitudinal direction by the pitch of the insulators, represented by the center-to-center spacing of the pins 32 of the discrete segments. Preferably, the splicing pin 42 is positioned such that the pins 44 are at the same height as that of the segment pins 32. The base 46 is configured so that its length below the segments, designated 48, is the same as the corresponding length of the neighboring segment pins 32. This is desirable because it allows the resultant spliced strip 50 to be reeled up on a reel 52 (FIG. 5) in the normal way, and does not interfere with processing of separated sections of the strip on a conventional placement or insertion machine. It will, however, be appreciated that the pin positions where the splicing pin 42 is located are lost. FIG. 3 illustrates the spliced arrangement from its bottom side, and also shows widened or shoulder regions 54 located on the pins to act as stops for positioning the splicing pin so that its respective lengths on opposite sides are preferably equal to or less than that of the segment pins 32. Where the pins 32 of the segments are press-fitted into the segments, then the pins 44 of the splicing device are also preferably press-fitted into the spliced segments.

Figure 6:
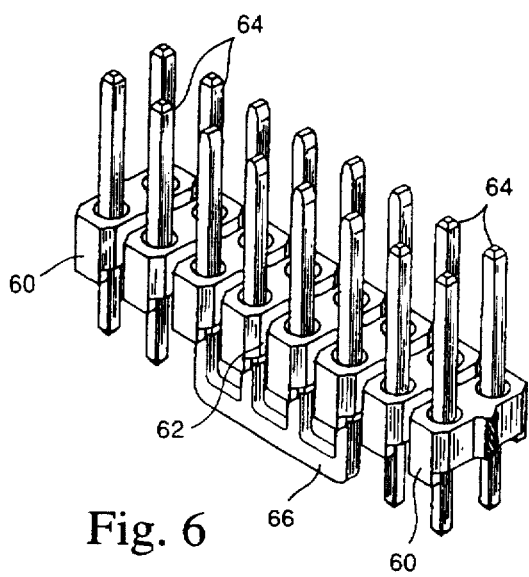
FIGS. 6 and 7 are partial perspective views similar to FIGS. 2 and 3 of another preferred embodiment in accordance with the invention.
Figure 7:
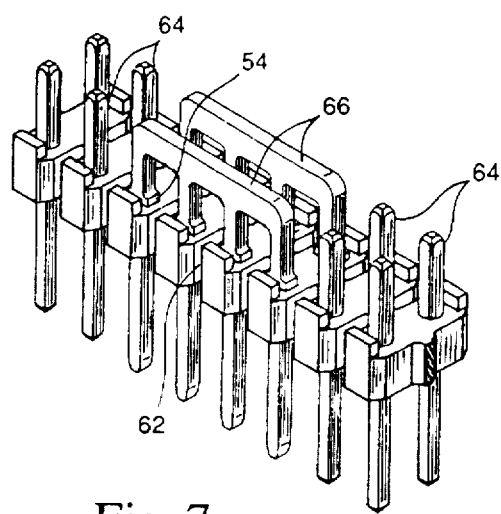

FIGS. 6 and 7 show another embodiment of the invention comprising a dual row pin header comprising discrete segments 60, separated by a break 62, each comprising pins 64, spliced together by a pair of splicing pins 66 which is similar to that employed in FIG. 2. Two splicing pins are used to prevent the segments from separating. In both this and the previous embodiment, splicing pins with at least four pins are preferred. If only two pins were present, the segments could rotate out of alignment, which might be disadvantageous in certain situations.

In the first embodiment described in connection with FIG. 1, a scrapless process is created where all positions of the pinned assembly are useable parts which can be assembled into a PCB without diferentiating between the normal units 18 and pinned units 20. Parts are separated from the strip by shearing the links 22; this provides a scrapless (no plastic slug removal) continuous plastic header. In the second embodiment described in connection with FIGS. 2–4, and 6 and 7, the pinned sections (joined by the splicing pin 42, 66) normally cannot be used and must be removed during an automatic assembly step, but this can be done preferably by automatic means. This is easily accomplished by providing means for automatic detection of the spliced units and their removal in the feeding and placement mechanism. Since the base portion 46 of the splicing pin 42 can be made equal to or less than the surrounding pin height, the pinned assembly can feed through the feeding mechanism without special consideration. The shoulder 54 acts as a seating over-travel which ensures proper dimensional requirements. The press fit area and pin tip length of the splicing pin are preferably equal to the pins which are assembled into the finished unit. Since the splicing pin is typically not used in the final assembly, the splicing pin can be made of any material suitable for this purpose, i.e., metal or plastic. In both cases, the automatic process machine is equipped with a feeding device which contains a reel of the continuous parts. The parts are fed through the feeder which supports the part during assembly, processing, or separation (cutting the connecting portions) for final use of the parts.

Where, as in the embodiments illustrated, the end product is a pin header, it is convenient for the splicing pin to have a similar configuration. Where, however, the articles in the header are tabs or terminals or items of different shapes, then the splicing device can be a splicing pin as illustrated, or have a different configuration generally corresponding in configuration to that of the other articles in the header. However the configuration used, the continuous strip with the splicing device in place should be able to be reeled up on a standard sized reel and processed by the conventional placement or insertion machines.

The splicing device in the second embodiment can be added to the assembly before or after the components are mounted in the segments. It is also possible to have as the splicing device a multiple pin device in which reduced size pins are used which will not protrude above the insulators 34, 36 in, for example, the embodiment in the view shown in FIG. 2, and thus the splicing is carried out within the stand-off area of the segment, i.e., the area below the insulators. This would allow the splicing device to be invisible to inspection equipment but visible by way of the base 46 to detection equipment.

The invention offers the following advantages. A continuously assembled strip of components, which creates a scrapless package, to permit automatic feeding of the component and/or assembly. A secure interlock device, which will not become loose or separate from the components after separation, and which does not require special continuous molding. A miniature interlock area that fits within the thickness of the insulator. A method of producing a continuous header which does not require special molding techniques. A structure, such as the link at the base of the pins, which can prevent automatic detection by vision equipment, or alternative construction to ensure automatic detection by vision equipment. A stop shoulder to assist in the assembly of the device.

The pins of the segments and of the splicing device may have a substantially square cross section, or alternatively be of a different cross-section, such as round or rectangular, and also may have an expanded "star" section in the area covered by the plastic header for improved strength and for form-fitting with the insulating plastic to prevent longitudinal displacement of the inserted pins. The notched regions 22 are directed substantially perpendicular to the longitudinal axis of the strip. By severing the strip at the two opposing notches, an electrical connector having a predetermined number of pin terminals can be formed.

There are also mechanical applications of the invention. One such example can be found in U.S. Pat. No. 5,148,596, (also incorporated herein by reference) which, in the embodiment disclosed in FIGS. 18–22, describes the insertion of posts on a PCB to serve as mechanical guides for electrical connectors. Such posts can also be inserted in holes in the continuous pinned strip of the invention, and positions containing one or more posts severed from the continuous strip for mounting on the PCB. It will also be appreciated from this application that the holes in the strip need not be through-holes, but can also be blind holes for receiving mechanical or electrical parts.

Similarly, while the more common and preferred arrangement employs evenly spaced through-holes with each hole in both the end and middle units filled with an electrical contact, there can be uses for uneven patterns of contacts. Thus, holes are not essential in all the units, nor are contacts essential in all the holes.

Similarly, with a strip of equally spaced holes and contacts, it is preferred to mold sets of notches separating each contact, allowing any desired header length to be severed at any of the notched separators. However, if the user has a need for, for example, 3-pin headers, then notches need only be provided between every third and fourth pin where severing will occur. Alternatively, if the user needs both 2-pin and 3-pin headers, then the notches need only be provided at 3 and 4 pin positions, thus where the user intends to sever discrete header components.

It will also be appreciated that other structures capable of weakening the strip along discrete lengths thereof, for easy separation of the strip at the weakened regions, can be substituted for the notches.

The number of units present in the molding of discrete segments is not critical. It can vary up to more than 50, depending on mold and part size. A typical value would be about 36 units with a pitch of about 0.1 inches, a height of about 0.1 inches, for 0.025 inch square standard pins, and with a web width, between the notches, of about ⅓ the unit width.

While the invention has been described in conjunction with specific embodiments, it will be evident to those skilled in the art that many alternatives, modifications and variations will be apparent in light of the foregoing description. Accordingly, the invention is intended to embrace all such alternatives, modifications and variations as fall within the spirit and scope of the appended claims.

What is claimed is:

1. A method of chaining together discrete segments comprising molded units having a hole containing components separated at a given pitch distance to form a continuous elongated strip comprising component-containing units while maintaining the given pitch distance, comprising the steps:

(a) providing at least first and second discrete molded segments each comprising units having holes containing components separated by said given pitch distance, said molded segments each comprising at least at one end a reduced-size end unit having a hole with the reduced-size end units of the first and second units free of components and being complementarily configured so that when fitted together they jointly form a unit with approximately the same size and shape as the units in the first and second segments and in-line with the other units, (b) positioning the first and second discrete segments end-to-end such that the end units fit together with their holes in aligned relationship, (c) introducing a component into the aligned holes to splice together the first and second discrete segments to form a continuous elongated strip comprising component-containing units while maintaining the given pitch distance between the components.

2. The method of claim 1, wherein the units are molded plastic, and the components are electrical or mechanical parts.

3. The method of claim 2, wherein the electrical parts are pins.

4. The method of claim 1, wherein the reduced-size ends of the first and second discrete segments are, respectively, a lower and upper half of a unit.

5. The method of claim 1, further comprising the step of reeling up the thus formed elongated strip.

6. A method of chaining together discrete segments comprising molded units having a hole containing components separated at a given pitch distance to form a continuous elongated strip comprising component-containing units while maintaining the given pitch distance, comprising the steps:

(a) providing at least first and second discrete molded segments each comprising units having holes containing components separated by said given pitch distance, said molded segments each comprising at least at one end at least one unit having a hole but no component, (b) positioning the first and second discrete segments end-to-end such that the end units are adjacent one another, (c) introducing a splicing device into the end unit holes to splice together the first and second discrete segments to form a continuous elongated strip comprising component-containing units while maintaining the given pitch distance between the components.

7. The method of claim 6, wherein the units are molded plastic, and the components are electrical or mechanical parts.

8. The method of claim 7, wherein the electrical parts are press-fitted pins.

9. The method of claim 6, wherein the splicing device comprises at least two connected pins spaced apart the given pitch distance and press-fitted into the end unit holes.

10. The method of claim 6, further comprising the step of reeling up the thus formed elongated strip.

11. A continuous elongated molded strip of moldable material containing a plurality of spaced approximately in-line components along substantially the length of said strip, comprising:
   (a) spaced discrete molded segments of moldable material,
   (b) each segment comprising a consecutive series of connected integral units having holes and comprised of first leading and second trailing end units and a plurality of middle units between the end units,
   (c) one of the first and second end units of each segment having a reduced-size unit configured to interfit with a complementary reduced-size unit on the adjacent segment so that their holes are aligned,
   (d) a component engaging the aligned holes of the complementary reduced-size units whereby successive segments are integrally coupled by their respective complementary reduced-size units and engaging component.

12. The strip of claim 11, further comprising a reel, said elongated strip of material being wound up on the reel.

13. The strip of claim 11, wherein the units are plastic molded header units, and the components are pins.

14. The strip of claim 11, wherein the components are press-fitted into the holes.

15. A continuous elongated molded strip of moldable material containing a plurality of spaced approximately in-line components along substantially the length of said strip, comprising:
   (a) spaced discrete molded segments of moldable material in end-to-end relationship,
   (b) each segment comprising a consecutive series of connected integral units having holes and containing components spaced apart a given pitch distance and comprised of first leading and second trailing end units and middle units between the end units,
   (c) a splicing device engaging the holes of the respective adjacent first and second end units whereby successive segments are integrally coupled into a continuous strip by the engaged component.

16. The strip of claim 15, further comprising a reel, said elongated strip of material being wound up on the reel.

17. The strip of claim 15, wherein the units are plastic molded header units, and the components are pins.

18. The strip of claim 17, wherein the splicing device comprises connected pins press-fitted into the holes of the adjacent first and second units.

19. The strip of claim 18, wherein the splicing device comprises at least two interconnected adjacent pins spaced apart by the given pitch distance.

20. The strip of claim 18, wherein the splicing device comprises four interconnected adjacent pins spaced apart by the given pitch distance.

21. The strip of claim 15, wherein the units are separated by severance means.

22. The strip of claim 15, wherein the moldable material is of plastic or metal.

23. The strip of claim 15, wherein the splicing device comprises means having general characteristics similar to that of the other components.

24. The strip of claim 15, wherein the splicing device comprises means having general characteristics dissimilar to that of the other components.

* * * * *

UNITED STATES PATENT AND TRADEMARK OFFICE
Certificate

Patent No. 5,775,945                                   Patented: July 7, 1998

On petition requesting issuance of a certificate for correction of inventorship pursuant to 35 U.S.C. 256, it has been found that the above identified patent, through error and without any deceptive intent, improperly sets forth the inventorship.

Accordingly, it is hereby certified that the correct inventorship of this patent is: Giuseppe Bianca, Robert M. Bogursky and Peter V. Bellantoni.

Signed and Sealed this Fifteenth Day of June, 1999.

BRIAN W. BROWN
*Special Programs Examiner*
Technology Center 2800